United States Patent [19]
Corwin et al.

[11] Patent Number: 6,009,111
[45] Date of Patent: Dec. 28, 1999

[54] SYSTEM AND A METHOD FOR FREQUENCY-STABILIZING A DIODE LASER

[75] Inventors: Kristan L. Corwin, Boulder, Colo.; Zheng-Tian Lu, Lisle, Ill.; Carter F. Hand, San Francisco, Calif.; Ryan J. Epstein, Loveland; Carl E. Wieman, Boulder, both of Colo.

[73] Assignee: University Technology Corporation, Boulder, Colo.

[21] Appl. No.: 09/062,629

[22] Filed: Apr. 17, 1998

Related U.S. Application Data

[60] Provisional application No. 60/044,076, Apr. 17, 1997.

[51] Int. Cl.$^6$ ....................................................... H01S 3/13
[52] U.S. Cl. ............................... 372/32; 372/20; 372/37; 372/27; 372/102; 372/38
[58] Field of Search .................................. 372/32, 29, 20, 372/37, 102, 27, 38, 106

[56] References Cited

U.S. PATENT DOCUMENTS 3,534,292  10/1970  Cutler .

OTHER PUBLICATIONS

B. Chéron et al., "Laser Frequency Stabilization using Zeeman Effect", *J. Phys. III*, 4, 1994, pp. 401–406.

K.B. MacAdam et al., "A Narrow–Band Tunable Diode Laser System With Grating Feedback, and A Saturated Absorption Spectrometer For Cs and Rb", *Am. J. Phys.*, 60(12), 1992, pp. 1098–1111.

C.E. Wieman et al., "Using Diode Lasers For Atomic Physics", *Rev. Sci. Instrum.*, 62(1), 1991, pp. 1–20.

*Primary Examiner*—Leon Scott, Jr.
*Attorney, Agent, or Firm*—Hill & Simpson

[57] ABSTRACT

A robust method of stabilizing a diode laser frequency to an atomic transition is provided. The method employs Zeeman shift to generate an anti-symmetric signal about a Doppler-broadened atomic resonance, and, therefore, offers a large recapture range as well as high stability. The frequency of a 780 nm diode laser, stabilized to such a signal in Rb, drifts less than 0.5 MHz$_{pk\text{-}pk}$ (one part in $10^9$) in thirty-eight hours. This tunable frequency lock may be inexpensively constructed, requires little laser power, rarely loses lock, and may be extended to other wavelengths by using different atomic species.

16 Claims, 2 Drawing Sheets

SYSTEM AND A METHOD FOR FREQUENCY-STABILIZING A DIODE LASER

This application claims benefit of provisional application 60/044076 filed Apr. 17, 1997.

This invention was made with government support under NSF Grant No. THY 9512150. The government may have certain rights in the invention.

BACKGROUND OF THE INVENTION

The present invention generally relates to a system and a method for stabilizing a diode laser frequency to an atomic transition. More specifically, the present invention relates to a method that employs Zeeman shift to stabilize a diode laser frequency.

Lasers with stable frequencies are essential in many fields of research. In addition, such lasers are used commercially in precision machining tools, gravimeters, and laser vibrometers. He-Ne lasers have been an industry standard for many years (see U.S. Pat. No. 3,534,292 to Cutler), but they are generally bulky, energy inefficient and have limited tube lifetimes.

Diode lasers offer an improvement in all these areas and may be stabilized to atomic transitions. Typical methods of stabilization as described in, for example, C. E. Wieman et al., "Using Diode Lasers for Atomic Physics," *Rev. Sci. Instrum.*, 62, 1191, pp. 1–20 and K. B. MacAdam et al., "A Narrow-Band Tunable Diode Laser System with Grating Feedback and a Saturated Absorption Spectrometer for Cs and Rb," *Am. J. Phys*, 60, 1992, pp. 1098–1111. While these stabilization methods may be practical in some laboratory settings, they are not reliable enough for use in commercial equipment.

The present invention, however, overcomes the deficiencies of previous methods. Using a technique originally demonstrated with an LNA laser in helium (see B. Cheron et al., "Laser Frequency Stabilization Using Zeeman Effect," *J. Phys. III,* 4, 1994, pp. 401–406), the present invention sets forth a very robust diode laser stabilization scheme that may be useful in both commercial instruments and research laboratories.

SUMMARY OF THE INVENTION

To this end, in an embodiment of the present invention, a method is provided for stabilizing a frequency of a diode laser to an atomic transition. The method comprises the steps of providing: a diode laser that generates a beam; splitting the beam creating a resultant beam; polarizing the resultant beam; providing a glass cell and a magnetic field through which the resultant beam passes; generating a DAVLL signal; and locking the diode laser to maintain the DAVLL signal.

In an embodiment, the diode laser is tuned using a diffraction grating.

In an embodiment, the glass cell is filled with Rb vapor.

In an embodiment, the magnetic field is created from a plurality of rings.

In an embodiment, a quarter wave plate is provided. Circular polarizations exiting from the cell are converted to orthogonal linear polarizations by passing the circular polarizations through the quarter wave plate.

In an embodiment, a polarizing beam splitter is provided. Linear polarizations are separated into two beams by the polarizing beam splitter.

In an embodiment, photo currents of the two beams are detected. One photo current is subtracted from the other photo current of the two beams creating a resultant signal. The resultant signal may be converted to a voltage. The voltage may then be fed to a piezo-electric transducer.

In an embodiment, a fast axis of the quarter wave plate is oriented to an axis of the polarizing beam splitter.

In an embodiment, the locked signal is tuned by adding an electronic offset.

In an embodiment, the locked signal is tuned by rotating the quarter wave plate to change the frequency by weighting one circular polarization more heavily.

In another embodiment of the present invention, a system is provided for stabilizing a frequency to an atomic transition. The system has a diode laser that generates a beam. A beam splitter splits the beam. A linear polarizer receives the split beam which creates a linear combination of circular polarizations. The system further has a glass cell filled with a vapor. A magnet is arranged around the glass cell wherein the linear combination of the circular polarizations passes through the glass cell and the magnet. A quarter wave plate converts the circular polarizations to orthogonal linear polarizations. A beam splitter separates the linear polarizations, and photo detectors receive signals from the beam splitters.

In an embodiment, a piezo-electric transducer feeds back a signal to the diode laser.

In an embodiment, the photo detectors produce photo current signals that are subtracted.

In an embodiment, the frequency of the laser is scanned across an atomic transition to generate an anti-symmetric curve.

In an embodiment, a fast axis of the quarter wave plate is oriented at an angle with respect to an axis of the beam splitter.

It is, therefore, an advantage of the present invention to provide a system and a method for stabilizing frequency in a diode laser.

Another advantage of the present invention is to provide a system and a method that may be inexpensively constructed for stabilizing frequency.

Yet another advantage of the present invention is to provide a system and a method for frequency stabilizing a diode laser that requires little laser power.

A still further advantage of the present invention is to provide a system and a method for frequency stabilizing a diode laser that rarely loses lock.

Moreover, an advantage of the present invention is to provide a system and a method for frequency stabilizing a diode laser that may be extended to other wavelengths by using different atomic and molecular species.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
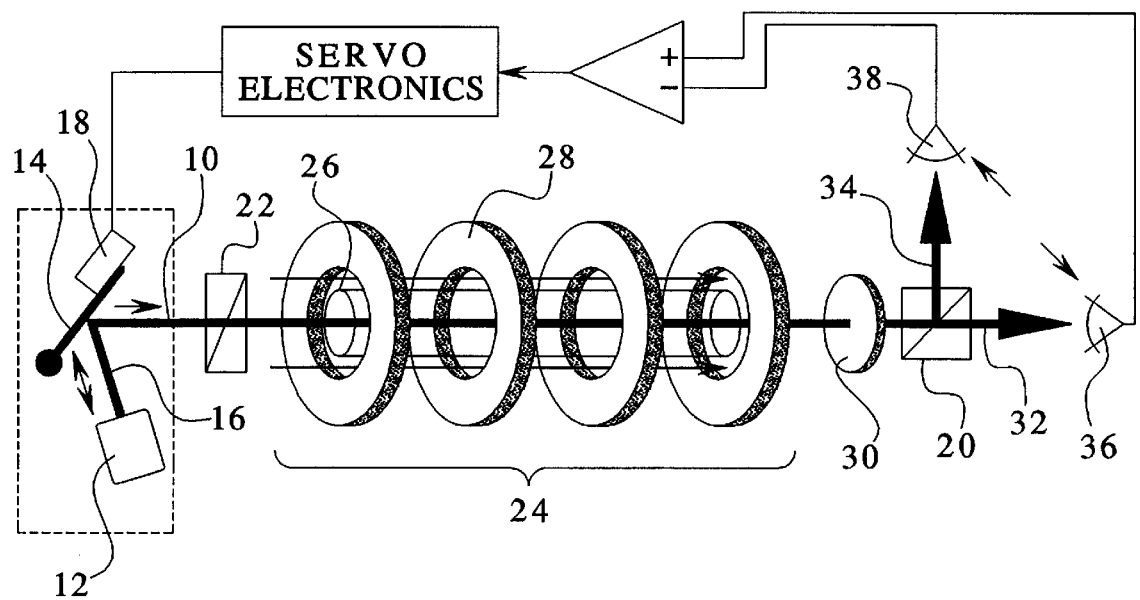
FIG. 1 illustrates a schematic diagram of an embodiment of a dichroic-atomic-vapor laser lock (DAVLL) system of the present invention.

Frequency of a diode laser with grating feedback depends on current, temperature, and external diffraction grating position (see Wieman et al. supra). Referring now to FIG. 1, a laser cavity in a Littrow configuration is shown. Although an entire beam is shown passing through a dichroic-atomic-vapor laser lock, only a small amount of power is, in actuality, picked off from the main beam and enters the locking apparatus. An output beam 10 reflects off a grating 14 while a first-order beam 16 diffracts back into the diode laser originating from a diode laser 12. The optical feedback from the grating 14 is spectrally narrowed and peaked at a frequency that may differ from a bare diode central frequency. Thus, this feedback narrows the laser linewidths to <1 MHz and forces the central frequency to nearly that of the feedback signal.

To tune the laser central frequency, the grating 14 is tilted by applying a voltage to a piezo-electric transducer (PZT) 18. Over time, the central frequency drifts due to temperature, current, and mechanical fluctuations. This drift may be reduced by stabilizing the laser to an external reference. In addition, small, rapid fluctuations in laser frequency, which contribute to the laser line width, may be reduced by rapidly controlling the current from diode laser 12.

Figure 2:
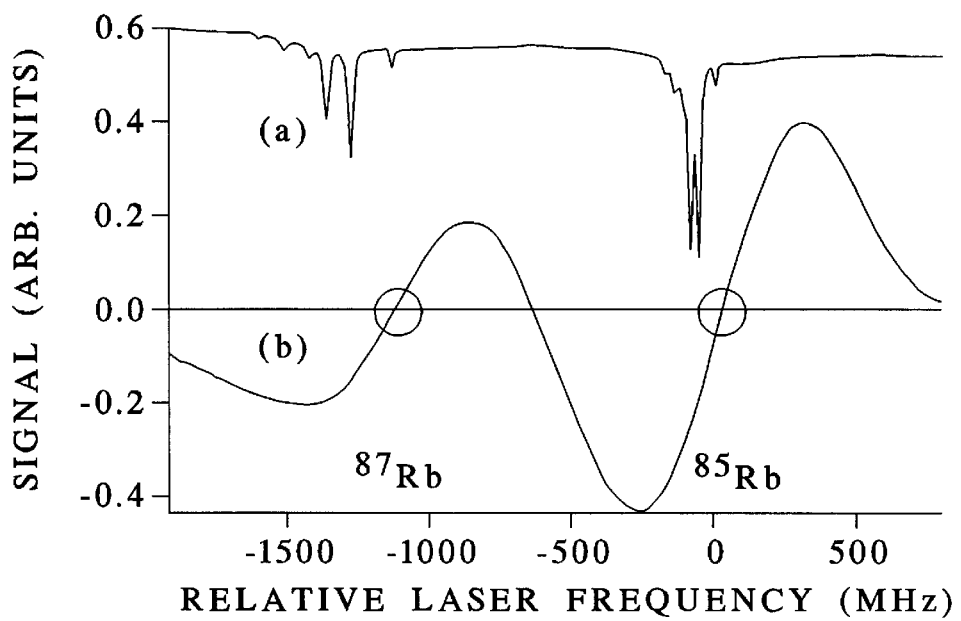
FIG. 2 illustrates a graph of an oscilloscope trace of a signal from a saturated absorption spectrometer designated at (a) and a DAVLL signal designated at (b) as the diode laser is scanned across Rb resonances with a PZT.

To stabilize the frequency of the diode laser 12, some of the output light is sent into a saturated absorption spectrometer. The diode laser frequency is then locked to either the side or the peak of the narrow saturated absorption features (described in Wieman et al. supra and W. Demtroder, *Laser Spectroscopy*, New York, Springer Verlag, 1996) as shown in FIG. 2. A laser can be locked to either of the two circled zero-srossings of the DAVLL signal. These features are due to the $^{87}$Rb F=2→F'=1,2,3 and the $^{85}$Rb F=3→F'=2,3,4 transitions. The frequency of the lock point may be tuned optically by rotating a quarter-wave plate 30, or electronically by adding an offset voltage to the signal. These narrow lines offer the advantage of a steep slope where the slope is the change in the fractional absorption signal with laser frequency. Side-locking to this slope is accomplished by electrically controlling the PZT voltage so that the saturated absorption signal is maintained at a particular level. However, a disadvantage of side-locking is that fluctuations in beam alignment and intensity alter the lock point and cause drift in the laser frequency. Peak-locking is less sensitive to these fluctuations, but has its own disadvantages related to phase-sensitive detection: either the output of the laser is modulated directly, or expensive electro-optic components are used to modulate only the light entering the spectrometer. A further disadvantage of both peak and side locks is their small capture range which prevents them from recovering from perturbations that shift the laser frequency by more than approximately 30 MHz.

To overcome the aforementioned disadvantages with the conventional locks, a dichroic-atomic-vapor laser lock (DAVLL) is provided. This technique employs a weak magnetic field to split Zeeman components of an atomic Doppler-broadened absorption signal and then generates an error signal that depends on the difference in absorption rates of the two components. The subtraction technique minimizes the frequency drifts that are due to changes in line shape and absorption which typically limit the utility of Doppler-broadened absorption features for frequency stabilization. The DAVLL lock offers advantages over saturated absorption including large recapture range, simplicity, low cost, and no need for frequency modulation.

Figure 3:
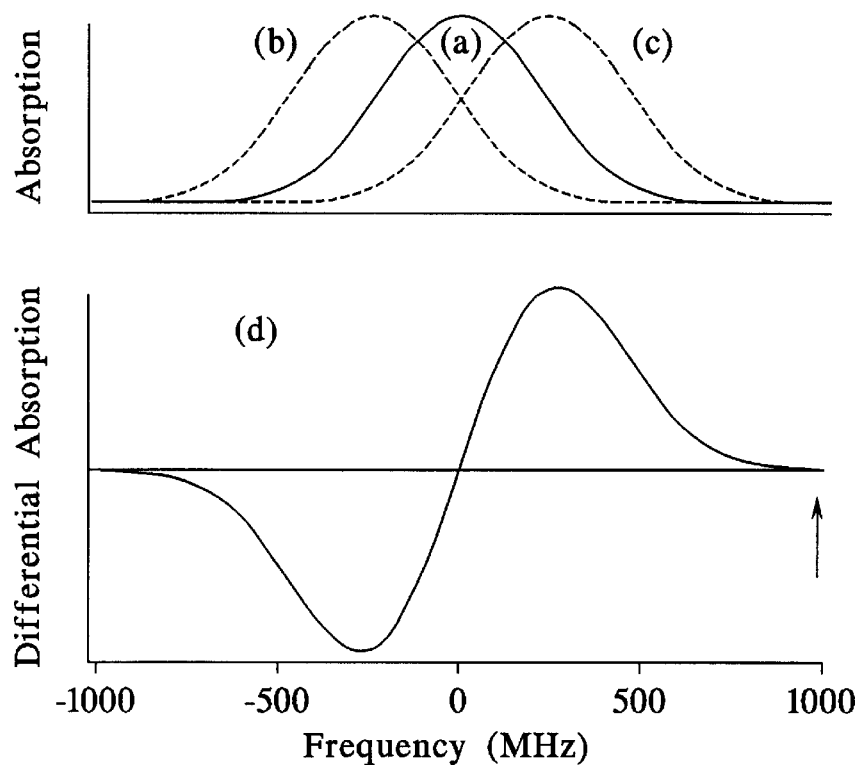
FIG. 3 illustrates a graph of origin of the DAVLL signal shape.

As shown in FIG. 3 at point (a) a Doppler-broadened absorption feature is detected when a laser beam (with wave vector k=kẑ) passes through a Rb vapor, and the laser's frequency is scanned across a transition. In the absence of a magnetic field, the same signal is obtained regardless of the laser polarization ($\vec{\epsilon}$). However, if a uniform magnetic field (B=Bẑ) is present, and the laser is circularly polarized ($\hat{\epsilon}=\sigma_+$), the central frequency of the absorption feature increases as identified at point (b) in FIG. 3. If the laser has the opposite polarization, ($\epsilon=\sigma_-$) as shown at point (c), the central frequency decreases. By subtracting the two absorption profiles as shown by (d) in FIG. 3, an anti-symmetric signal is obtained that passes through zero and is suitable for locking. The arrow in FIG. 3 indicates that the off resonant signal is zero (in the idealized case).

A DAVLL signal with a steep slope causes the lock to be less sensitive to noise sources that mimic laser frequency changes, such as laser intensity noise. A rough comparison with a typical saturated absorption set-up shows that the DAVLL slope is comparable to that of saturated absorption lines. This may seem surprising at first because the line widths of the saturated absorption lines (FWHM~20 MHz) are much smaller than those of the DAVLL lines (~500 $MHz_{pk-pk}$) as shown by (b) in FIG. 2. However, the heights of the saturated absorption features range from approximately $\frac{1}{3}$ to $\frac{1}{30}$ of the on-resonant Doppler-broadened absorption fraction while the DAVLL signal height is twice that absorption fraction. By approximating the slope as the line width divided by the signal height, the slope of the largest saturated absorption peak is estimated at only four times bigger than the DAVLL slope.

The slope of the DAVLL signal is also affected by magnetic field. The separation of two Zeeman-shifted absorption peaks must be large enough to give a sizable capture range, but small enough to give a large slope through the unshifted resonance. In addition, the Zeeman-shifted absorption peaks broaden with increasing field because various transitions contained within one Doppler-broadened feature shift different amounts. 100 G maximizes the slope, and, therefore represents the best compromise between increased separation and increased broadening. However, the dependence of slope on magnetic field is not strong so varying B by a factor of two should not significantly alter the lock performance.

A schematic of the diode laser 12 and optics used to generate the DAVLL signal is shown in FIG. 1. An SDL 780 nm diode laser is tuned using the diffraction grating 14, as described above. The output beam 10 from the diode laser 12 passes through a beam splitter 20, and a small amount of power is split off to be used for locking. After passing through a small aperture (not shown), the resulting beam passes through a linear polarizer 22. Pure linear polarization is equivalent to a linear combination of equal amounts of two circular polarizations. This beam (2.5 mm dia., 0.5 mW) next passes through a cell-magnet combination 24 consisting of a glass cell 26 filled with Rb vapor and a 100 G magnetic field. A magnet 28 is made of rings (four rings are shown in FIG. 1) of rubber-embedded permanently magnetic material, spaced appropriately and glued together concentrically around the glass cell 26 (for material, see Part number PSM1-250-3X36X from The Magnet Source, Castle Rock, Colo., 80104). In a preferred embodiment, eight or nine rings are implemented on a 4.5 inch long vapor cell. Of course, any number of rings may be used in the present invention depending on the application and the length of the cell 26.

To generate the DAVLL signal, the absorption profiles of the $\sigma_+$ light must be subtracted from that of the C light. To accomplish this, after exiting the cell 26, the two circular polarizations are converted into two orthogonal linear polarizations by passing through the quarter-wave plate 30. Then, the two linear polarizations are separated by a polarizing beam splitter 20. The resulting two beams 32,34 are incident on two photo detectors 36,38, respectively, whose photo currents are subtracted. As the frequency of the laser is scanned across an atomic transition, an anti-symmetric curve is generated as shown in FIGS. 2 and 3. The diode laser 12 is then locked by feeding back a voltage to the PZT 18 so that the DAVLL signal is maintained at a central zero crossing.

The optics are aligned by orienting a fast axis of the quarter-wave plate 30 at 45° to an axis of the output polarizing beam splitter 20, so that equal intensities are incident on the two photo detectors 36,38 when the laser is far-detuned (>1 GHz) from the Rb resonances. See reference (d) in FIG. 3. The DAVLL system is least susceptible to drifts when the off-resonant signal gives no net photo current, and the lock is, therefore, very near the center of the unshifted resonance as shown in FIGS. 2 and 3. The locked laser frequency is tuned either by adding an electronic offset or by rotating the quarter-wave plate 30. The latter optical method changes the frequency by weighting one circular polarization more heavily than the other. This type of offset is more stable than the electronic offset because the lock point is always at a zero in net photo current which occurs when the powers incident on the two photo detectors 36,38 are equal. Thus with optical offsets, the lock point maintains its insensitivity to laser intensity fluctuations.

To monitor the frequency stability of the laser lock, two separate lasers are stabilized each to their own DAVLL system. The lasers are locked to the same Doppler-broadened feature ($^{85}$Rb F=3→F') with different optical offsets, typically about 25 MHz apart. A portion of the light from each laser is combined at a beam splitter and co-propagated onto a fast photo detector (125 MHz) The resulting beat note, corresponding to the difference between the two laser frequencies, is fed into a high-speed counter. By reading the counter every five seconds, a computer monitors the laser stability over periods ranging from twelve to thirty-eight hours.

Figure 4:
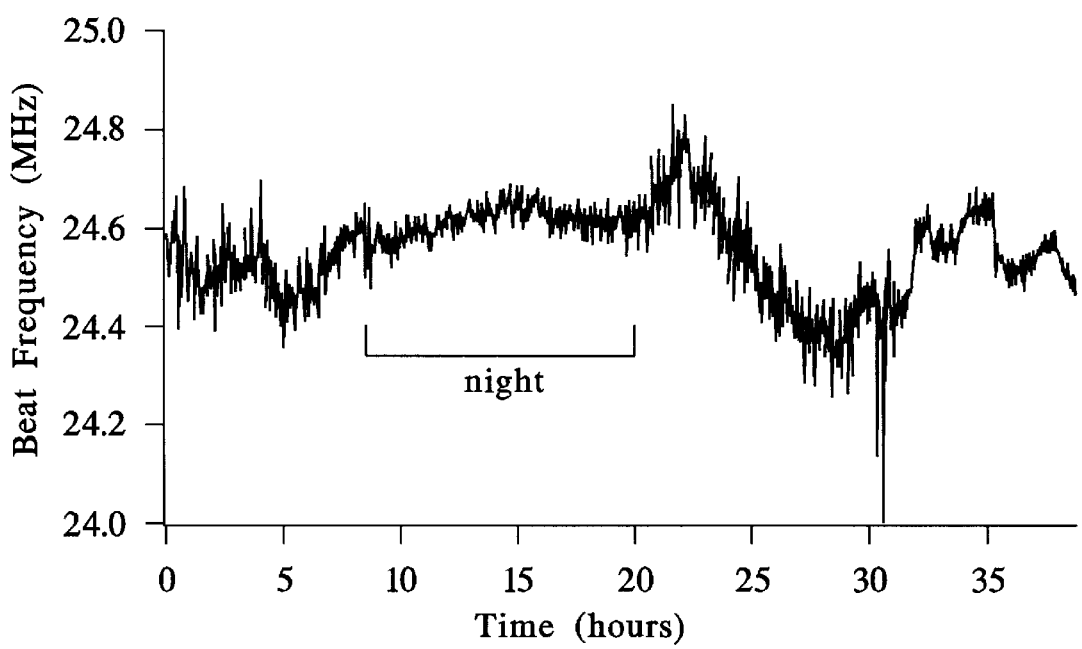
FIG. 4 is graph illustrating measured beat frequency between two DAVLL systems.

In this way, the difference between the two laser frequencies may be monitored over many days under different conditions. The beat frequency is stable to 2.0 $MHz_{pk-pk}$ while the temperature of the laboratory, and therefore of the optical components, varies a couple of degrees throughout the day. Variations in the beat frequency indicate the limits of the laser stability to be about 500 $kHz_{pk-pk}$. These data show a stability of 27 $kHZ_{rms}$ during an eleven hour period at night when environmental factors such as room temperature and air currents are more stable. The discontinuities at the end of the run are due to incomplete shielding of the detection photodiodes from room lights. The run stops when a laser mode hops, but after adjusting the current to return the laser to the proper mode, it returns to the same frequency. When the cells (with attached magnets) are enclosed in a copper pipe and crudely temperature-stabilized, the stability improves to 500 $kHz_{pk-pk}$ over thirty-eight hours as shown in FIG. 4. The cell-magnet combinations have measured dependencies of 1.0 MHz/° C. and 1.7 MHz/° C. This drift is attributed to a temperature-dependent bi-refringence of the cell windows because the lock point is more sensitive to bi-refringence than any other parameters. To confirm that optical offsets are more stable than electronic, an optical offset is used to tune one laser 120 MHz away and found that the drift rate is still comparable. When similar frequency offsets are applied electronically, the drift increases to 3 $MHz_{pk-pk}$.

If the two lasers drift in a correlated manner, then the difference frequency remains constant so the above measurement is insensitive to it. To confirm that this is not occurring, the stability of one DAVLL system may be measured by beating it against a second diode laser that is locked to a peak of a saturated absorption feature. Since the physics of the two locks is quite different, drifts are expected in the two systems to have different dependencies. In this case, a stability of 200 $kHz_{pk-pk}$ over twelve hours is observed which is consistent with the result previously described. From this, it is shown that the two DAVLL systems are not drifting in a correlated manner, and the stability of the beat frequency may be interpreted as the stability of the absolute frequency.

The frequency stability of the lock may also be predicted without comparing two separate systems. The stability of the off-resonant signal level (FIG. 3) may be converted to an equivalent frequency stability by multiplying the fluctuations in photo current by the slope of the central resonant DAVLL signal. This calculation may reliably predict the frequency stability of the locked system and is, therefore, a simple, useful diagnostic. The agreement between the predicted and measured stability also indicates that the primary source of drift is changing bi-refringence of the optical components because bi-refringence equally affects the signal levels both on and off resonance. As a final testament to the lock's stability, these lasers may be used to maintain a Rb magneto-optical trap (MOT) for many days without adjusting the lasers that may be locked to DAVLL systems.

The above results were obtained using zero-order glass/polymer retarders, calcite Glan-Thompson input polarizers, and calcite Wollaston prism beam splitters. Comparable stability has also been found while using less expensive optics, including a plastic film polarizer, a plastic film retarder ($\lambda/4$ at 540 nm), and a single calcite crystal (used as a polarizing beam splitter). In contrast, some dielectric polarizing beam splitting cubes may give a large temperature dependence.

The DAVLL lock is very robust due to the very broad locking signal. In fact, mechanical perturbations may be applied to the optical table up to the table's damage threshold (including banging on the table with a hammer), and this is unable to knock the lasers out of lock. The lasers may jump every couple of days due to one of the lasers jumping to a different mode of the laser chip. These jumps are usually due to temperature drifts in the laser chip, but may occasionally be caused by a fast electromagnetic pulse, such as that produced by turning on a large nearby argon ion laser. These types of mode hops are not observed in diodes with good anti-reflection coatings because the chip resonances are greatly suppressed. Therefore, a DAVLL system constructed with such diodes likely never loses lock.

The DAVLL lock provides an effective method for stabilizing a diode laser to a very broad, stable atomic reference. In comparison to saturated absorption locks, the system stays locked for much longer periods of time and requires fewer optics, less electronics, and less laser power. It may also be quite compact and inexpensive. This simple robust stabilization scheme works for a number of atomic and molecular species at a variety of wavelengths and is an appealing option whenever a continuous stable laser frequency is desired.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A method for stabilizing a frequency of a diode laser to an atomic transition, the method comprising the steps of:
   providing a diode laser that generates a beam;
   splitting the beam creating a resultant beam;
   polarizing the resultant beam;
   providing a glass cell and magnetic field through which the resultant beam passes;
   generating a DAVLL signal; and
   locking the diode laser to maintain the DAVLL signal.

2. The method of claim 1 further comprising the step of:
   tuning the diode laser using a diffraction grating.

3. The method of claim 1 wherein the glass cell is filled with Rb vapor.

4. The method of claim 1 wherein the magnetic field is created from a plurality of rings.

5. The method of claim 1 further comprising the step of:
   providing a quarter wave plate; and
   converting circular polarizations exiting from the cell to orthogonal linear polarizations by passing the circular polarizations through the quarter wave plate.

6. The method of claim 5 further comprising the step of:
   providing a polarizing beam splitter; and
   separating the linear polarizations into two beams by the polarizing beam splitter.

7. The method of claim 6 further comprising the step of:
   detecting photo currents of the two beams; and
   subtracting one photo current from the other photo current of the two beams creating a resultant beam.

8. The method of claim 7 further comprising the steps of:
   converting the resultant signal to a voltage; and
   feeding the voltage to a piezo-electric transducer.

9. The method of claim 6 further comprising the step of:
   orienting a fast axis of the quarter wave plate to an axis of the polarizing beam splitter.

10. The method of claim 1 further comprising the step of:
    tuning the locked signal by adding an electronic offset.

11. The method of claim 5 further comprising the step of:
    tuning the locked signal by rotating the quarter wave plate to change the frequency by weighting one circular polarization more heavily.

12. A system for stabilizing a frequency to an atomic transition, the system comprising:
    a diode laser generating a beam;
    a beam splitter splitting the beam;
    a linear polarizer receiving the split beam creating a linear combination of circular polarizations;
    a glass cell filled with a vapor;
    a magnet arranged around the glass cell wherein the linear combination of the circular polarizations passes through the glass cell and the magnet;
    a quarter wave plate converting the circular polarizations to orthogonal linear polarizations;
    a beam splitter separating the linear polarizations; and
    photo detectors receiving signals from the beam splitters.

13. The system of claim 12 further comprising:
    a piezo-electric transducer feeding back a signal to the diode laser.

14. The system of claim 12 wherein the photo detectors produce photo current signals that are subtracted.

15. The system of claim 12 wherein frequency of the laser is scanned across an atomic transition to generate an anti-symmetric curve.

16. The system of claim 12 wherein a fast axis of the quarter wave plate is oriented at an angle with respect to an axis of the beam splitter.

* * * * *